United States Patent
Lavoie et al.

(10) Patent No.: US 8,987,135 B2
(45) Date of Patent: Mar. 24, 2015

(54) METHOD TO CONTROL METAL SEMICONDUCTOR MICRO-STRUCTURE

(71) Applicants: International Business Machines Corporation, Armonk, NY (US); GLOBALFOUNDRIES Inc., Grand Cayman (KY)

(72) Inventors: Christian Lavoie, Ossining, NY (US); Ahmet S. Ozcan, Pleasantville, NY (US); Zhen Zhang, Ossining, NY (US); Bin Yang, San Carlos, CA (US)

(73) Assignees: International Business Machines Corporation, Armonk, NY (US); GLOBALFOUNDRIES, Inc. (KY)

( * ) Notice: Subject to any disclaimer, the term of this patent is extended or adjusted under 35 U.S.C. 154(b) by 99 days.

(21) Appl. No.: 13/908,624

(22) Filed: Jun. 3, 2013

(65) Prior Publication Data

US 2013/0267090 A1 Oct. 10, 2013

Related U.S. Application Data

(62) Division of application No. 13/006,664, filed on Jan. 14, 2011, now Pat. No. 8,456,011.

(51) Int. Cl.
| | |
|---|---|
| H01L 21/44 | (2006.01) |
| H01L 21/768 | (2006.01) |
| H01L 21/285 | (2006.01) |
| H01L 23/485 | (2006.01) |
| H01L 29/45 | (2006.01) |
| H01L 29/66 | (2006.01) |

(52) U.S. Cl.
CPC ........ *H01L 21/768* (2013.01); *H01L 21/28518* (2013.01); *H01L 23/485* (2013.01); *H01L 29/456* (2013.01); *H01L 29/66545* (2013.01); *H01L 29/66575* (2013.01)
USPC ........................... 438/655; 438/652; 438/597

(58) Field of Classification Search
USPC ......................................... 438/655, 652, 597
See application file for complete search history.

(56) References Cited

PUBLICATIONS

Detavernier, C., et al., "Texture in thin films", Proceedings, 2005, http://www.scientific.net, Trans Tech Publications, Switzerland.

*Primary Examiner* — Long Pham
(74) *Attorney, Agent, or Firm* — Scully, Scott, Murphy & Presser, P.C.; Yuanmin Cai

(57) ABSTRACT

A method of forming a metal semiconductor alloy that includes forming an intermixed metal semiconductor region to a first depth of a semiconductor substrate without thermal diffusion. The intermixed metal semiconductor region is annealed to form a textured metal semiconductor alloy. A second metal layer is formed on the textured metal semiconductor alloy. The second metal layer on the textured metal semiconductor alloy is then annealed to form a metal semiconductor alloy contact, in which metal elements from the second metal layer are diffused through the textured metal semiconductor alloy to provide a templated metal semiconductor alloy. The templated metal semiconductor alloy includes a grain size that is greater than 2× for the metal semiconductor alloy, which has a thickness ranging from 15 nm to 50 nm.

13 Claims, 4 Drawing Sheets

METHOD TO CONTROL METAL SEMICONDUCTOR MICRO-STRUCTURE

CROSS REFERENCE TO RELATED APPLICATION

This application is a divisional of U.S. patent application Ser. No. 13/006,664, filed Jan. 14, 2011 the entire content and disclosure of which is incorporated herein by reference.

BACKGROUND

The present disclosure relates generally to the field of semiconductor device processing techniques, such as the formation of metal semiconductor alloys, which are typically referred to as metal silicides. Metal silicide formation typically requires depositing a metal such as Ni, Co, Pd, Pt, Rh, Ir, Zr, Cr, Hr, Er, Mo or Ti onto the surface of a silicon-containing material or wafer. Following deposition, the structure is subjected to an annealing step using conventional processes such as, but not limited to, rapid thermal annealing. During thermal annealing, the deposited metal reacts with silicon to form a metal silicide. Portions of the metal not formed atop silicon are not reacted during the anneal, and may thus be selectively removed with respect to the reacted silicide.

SUMMARY

In one embodiment, the present disclosure provides a method of a forming a metal semiconductor alloy. The method of forming a metal semiconductor alloy may include forming a first metal layer on a semiconductor substrate to provide an intermixed metal semiconductor region to a first depth of the semiconductor substrate without thermal diffusion. A portion of the first metal layer that does not include the intermixed metal semiconductor region may then be removed. The intermixed metal semiconductor region is annealed to form a textured metal semiconductor alloy. A second metal layer is formed on the textured metal semiconductor alloy. The second metal layer that is formed on the textured metal semiconductor alloy may then be annealed, in which metal elements from the second metal layer are diffused through the textured metal semiconductor alloy to provide a templated metal semiconductor alloy having a grain size that is greater than 1.5× to less than 3.5×. The templated metal semiconductor alloy has a thickness ranging from 15 nm to 50 nm.

In another aspect, the present disclosure provides a metal semiconductor alloy contact on a semiconductor layer. In one embodiment, the metal semiconductor alloy contact includes a textured metal semiconductor alloy layer having a thickness of less than 25 Å extending to a first depth of the semiconductor layer, and a templated metal semiconductor alloy layer in direct contact with the textured metal semiconductor alloy layer and extending to a second depth of the semiconductor layer that is greater than the first depth. The templated metal semiconductor alloy layer may have the same crystalline orientation as the textured metal semiconductor alloy. The templated metal semiconductor alloy also includes metal semiconductor crystal grains having an in-plane texture to semiconductor crystal grains of the semiconductor layer at an interface between the semiconductor layer and the templated metal semiconductor alloy. In one embodiment, the templated metal semiconductor alloy has a grain size that is greater than 2.0× a thickness of the metal semiconductor alloy contact.

In yet another aspect, the present disclosure provides a method of forming a semiconductor device. In one embodiment, the method of forming a semiconductor device includes providing a semiconductor substrate comprising a source region and a drain region on opposing sides of a sacrificial gate structure. A first metal layer is formed on at least one of the source region and the drain region to provide an intermixed metal semiconductor region to a first depth of the semiconductor substrate without thermal diffusion. A portion of the first metal layer that does not include the intermixed metal semiconductor region is removed, and the intermixed metal semiconductor region is annealed to form a textured metal semiconductor alloy to a first depth of the semiconductor substrate. At least one dielectric layer is formed on the textured metal semiconductor alloy having a first opening exposing the sacrificial gate structure. The sacrificial gate structure is replaced with a functioning gate structure. A second opening is etched through the at least one dielectric layer selectively to the textured metal semiconductor alloy. A second metal layer is formed on the textured metal semiconductor alloy. The second metal layer on the textured metal semiconductor alloy is annealed to form a templated semiconductor alloy to a second depth of the semiconductor substrate that is greater than the first depth of the semiconductor substrate. The textured metal semiconductor alloy and the templated semiconductor alloy provide a metal semiconductor alloy contact to the at least one of the source region and the drain region.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
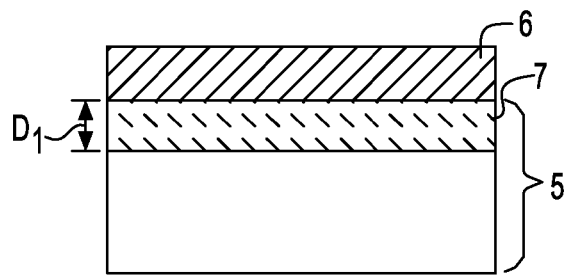
FIG. 1 is a side cross-sectional view of one embodiment of forming a first metal layer on a semiconductor substrate to provide an intermixed metal semiconductor region to a first depth of the semiconductor substrate without thermal diffusion, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to metal semiconductor alloys. A "metal semiconductor alloy" is an alloy of a metal and semiconductor. An alloy is homogeneous mixture or solid solution, in which the atoms of the metal replace or occupy interstitial positions between the atoms of the semiconductor. Contacts composed of metal semiconductor alloy may be formed to semiconductor devices, such as field effect transistors (FETs).

Morphological stability of polycrystalline films, such as metal semiconductor alloys, depends on grain orientation with the semiconductor substrate and grain size. In some embodiments, grain orientations with low interface energy and larger grain sizes are preferred. Metal semiconductor alloys, such as nickel silicide, are typically polycrystalline with a grain size of about 1.5 times the thickness of metal semiconductor alloy, in which the metal semiconductor alloy has a thickness ranging from 15 nm to 50 nm. When the metal semiconductor alloy has a thickness on the order of 15 nm to 50 nm, the grains of the metal semiconductor typically have a random texture or fiber texture with respect to the semiconductor substrate that the metal semiconductor alloy is formed on.

Texture in the context of material science denotes crystalline orientation. A material having a random texture has no restriction on the grain orientation with respect to the semiconductor substrate, i.e., the crystal orientations of the material are randomly distributed. Therefore, the grains of metal semiconductor alloys that have a random texture do not have a specified orientation with respect to the semiconductor substrate on which the metal semiconductor alloy is formed. A fiber texture is an axis specific texture, in which a specific crystal plane of the grains is parallel to the sample surface, leaving a single degree of freedom in the orientation of the grains with respect to the substrate surface. Similar to the grains of a metal semiconductor alloy having a random texture, the grains of a metal semiconductor alloy having a fiber texture are not aligned to the grains of the semiconductor layer on which the metal semiconductor alloy is formed. In some examples, as the thickness of the metal semiconductor alloy layer, such as a nickel silicide layer, is reduced to less than 7 nm, such as nickel silicide layers, the metal semiconductor alloy may have an in-plane texture to the grains of the semiconductor substrate on which the metal semiconductor alloy is formed. Metal semiconductor alloys having an in-plane texture include grains having an orientation that is completely fixed to the semiconductor layer.

Referring to FIGS. 1-5, and in some embodiments, the present disclosure provides metal semiconductor alloys with a thickness on the order of 15 nm to 50 nm, in which the grains of the semiconductor alloy have an in-plane texture to the grains of the semiconductor layer on which the metal semiconductor alloy is formed. To provide metal semiconductor alloy contacts to semiconductor devices having the above thickness and texture, the present disclosure forms a textured metal semiconductor alloy 7 using an intermix metal semiconductor alloy process, and then forms a second metal semiconductor alloy atop the textured metal semiconductor alloy 7, wherein the textured metal semiconductor alloy 7 functions as a template to control the orientation of the grains of the second metal semiconductor alloy 8 as it is formed to greater depths of the semiconductor substrate 5. Because the second metal semiconductor alloy 8 is formed through the textured metal semiconductor alloy 7, and the textured metal semiconductor alloy 7 controls the orientation of the grains of the second metal semiconductor alloy 8, the second metal semiconductor alloy 8 is hereafter referred to as a "templated metal semiconductor alloy".

FIG. 1 depicts one embodiment of forming a first metal layer 6 on a semiconductor substrate 5 to provide an intermixed metal semiconductor region 7 to a first depth of the semiconductor substrate 5 without thermal diffusion. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

Although not depicted in FIG. 1, the semiconductor substrate 5 may be doped to provide the source region or drain region of a semiconductor device, such as a field effect transistor, or may be doped to provide a substrate contact. It is noted that the metal semiconductor alloy may be formed to any type of electrical device. For example, the semiconductor substrate 5 may include semiconductor devices, e.g., field effect transistors, finFET, bipolar junction transistors (BJT) and Schottky barrier semiconductors, memory devices, e.g., dynamic random access memory (DRAM), embedded dynamic random access (eDRAM), flash memory, resistors and capacitors, etc.

The first metal layer 6 may be formed on the semiconductor substrate 5 using a physical vapor deposition (PVD) process, such as plating, e.g., electroplating or electroless deposition, or sputtering. In one example, the first metal layer 6 is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface, i.e., upper surface of the semiconductor substrate 5. Examples of sputtering apparatus that may be suitable for depositing the first metal layer 6 include DC diode type systems, radio frequency (RF) sputtering, magnetron sputtering, and ionized metal plasma (IMP) sputtering.

In one embodiment, metal is deposited onto the upper surface of the semiconductor substrate 5 to form a first metal layer 6 with a thickness ranging from 1 nm to 30 nm. In another embodiment, the first metal layer 6 is deposited to a thickness ranging from 1 nm to 20 nm. In yet another embodiment, the first metal layer 6 is deposited to a thickness ranging from 5 nm to 15 nm. The first metal layer 6 may be composed of nickel (Ni), platinum (Pt), cobalt (Co), erbium (Er), tantalum (Ta), titanium (Ti), tungsten (W), palladium (PD) and combinations thereof.

In one example, the first metal layer 6 is composed of substantially 100 wt. % nickel (Ni). By substantially it is meant that the first metal layer 6 may further include incidental impurities. "Incidental impurities" denote any contamination of the deposition source. Allowable ranges of impurities are less than 0.05 wt % for each impurity constituent and 0.15 wt % for total impurity content. In another embodiment, the first metal layer 6 may be composed of an alloy of two or metal elements, e.g., a nickel platinum alloy. For example, when the first metal layer 6 is composed of an alloy of nickel and platinum, the platinum content of the nickel platinum alloy may be as great as 15 wt. %. In one embodiment, when the first metal layer 6 is composed of an alloy of nickel and platinum, the platinum content of the nickel platinum alloy may range from 1 wt. % to 10 wt. %.

An intermixed metal semiconductor region 7 is formed to a first depth of the semiconductor substrate 5. By "intermixed" it is meant that the region includes metal elements from the first metal layer 6 and semiconductor elements from the semiconductor substrate 5. The intermixed region typically has an amorphous crystalline structure. By amorphous crystalline structure it is meant that the intermixed metal semiconductor region 7 is a non-crystalline solid, having no periodicity or long range order. The intermixed metal semiconductor region 7 forms immediately after the first metal layer 6 is deposited on the semiconductor substrate 5. The intermixed metal semiconductor region 7 is formed without thermal diffusion, which means that the intermixed metal semiconductor region 7 is formed at room temperature, e.g., 20° C. to 25° C., and at atmospheric pressure, e.g., 1 atm. Distinguished from an intermixed metal semiconductor region 7, a metal semiconductor alloy requires thermal diffusion that is induced by annealing metal and semiconductor containing materials that are in contact.

The formation of the intermixed metal semiconductor region 7 is a self-limiting process. In one embodiment, by "self-limiting" it is meant that the metal elements from the first metal layer 6 will diffuse to a depth within the semiconductor substrate 5 that is no greater than 20 Å for deposited thickness of the first metal layer 6. The intermixed metal semiconductor region 7 may have a thickness D1 ranging from 5 Å to 25 Å, as measured from the upper surface of the semiconductor substrate 5. In another embodiment, the intermixed metal semiconductor region 7 may have a thickness D1 ranging from 10 Å to about 20 Å, e.g., 21 Å as measured from the upper surface of the semiconductor substrate 5.

Table 1 below lists nickel (Ni) amounts (in thicknesses) in the intermixed metal semiconductor region 7 that may result from depositing various thicknesses and compositions of first metal layer 6 onto a silicon surface of the semiconductor substrate 4.

TABLE 1

| First metal layer thickness | Metal target composition (atm. %) | Ni amount in the intermix |
| --- | --- | --- |
| 1 nanometer (nm) | Ni | about 10 angstroms (A) |
| 1 nm | Ni5%Pt | about 11 A |
| 1 nm | Ni10%Pt | about 11 A |
| 2 nm | Ni | about 16 A |
| 2 nm | Ni5%Pt | about 20 A |
| 2 nm | Ni10%Pt | about 21 A |
| 4 nm | Ni | about 16 A |
| 4 nm | Ni5%Pt | about 14 A |
| 4 nm | Ni10%Pt | about 14 A |
| 6 nm | Ni | about 16 A |
| 6 nm | Ni5%Pt | about 14 A |
| 6 nm | Ni10%Pt | about 14 A |
| 8 nm | Ni | about 15 A |
| 8 nm | Ni5%Pt | about 14 A |
| 8 nm | Ni10%Pt | about 15 A |
| 10 nm | Ni | about 16 A |
| 10 nm | Ni5%Pt | about 14 A |
| 10 nm | Ni10%Pt | about 15 A |
| 15 nm | Ni | about 17 A |
| 15 nm | Ni5%Pt | about 13 A |
| 15 nm | Ni10%Pt | about 15 A |
| 20 nm | Ni | about 17 A |
| 20 nm | Ni5%Pt | about 13 A |
| 20 nm | Ni10%Pt | about 15 A |

Table 2 below lists percentages of platinum (Pt) in the intermixed metal semiconductor region 7 that may result from various thicknesses and compositions of the first metal layer 6.

TABLE 2

| First Metal layer thickness | Metal target composition (atm. %) | Intermixed region atm. % Pt |
|---|---|---|
| 1 nm | Ni5%Pt | about 4.5% |
| 1 nm | Ni10%Pt | about 7% |
| 2 nm | Ni5%Pt | about 3.8% |
| 2 nm | Ni10%Pt | about 7% |
| 4 nm | Ni5%Pt | about 9% |
| 4 nm | Ni10%Pt | about 16% |
| 6 nm | Ni5%Pt | about 11% |
| 6 nm | Ni10%Pt | about 15.5% |
| 8 nm | Ni5%Pt | about 9.5% |
| 8 nm | Ni10%Pt | about 16% |
| 10 nm | Ni5%Pt | about 11% |
| 10 nm | Ni10%Pt | about 15.5% |
| 15 nm | Ni5%Pt | about 11% |
| 15 nm | Ni10%Pt | about 15.5% |
| 20 nm | Ni5%Pt | about 9% |
| 20 nm | Ni10%Pt | about 16% |

Figure 2:
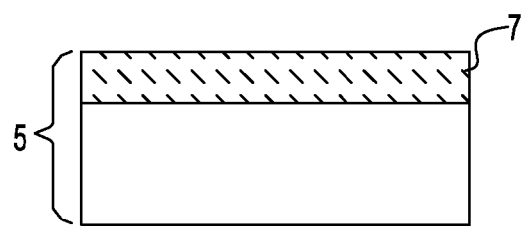
FIG. 2 is a side cross-sectional view of removing a portion of the first metal layer that does not include the intermixed metal semiconductor region, in accordance with the present disclosure.

FIG. 2 depicts one embodiment of removing a portion of the first metal layer 6 that does not include the intermixed metal semiconductor region 7. The portion of the first metal layer 6 that does not include the intermixed metal semiconductor region 7 may be removed by an etch process that is selective to the intermixed metal semiconductor region 7. As used herein, the term "selective" in reference to a material removal process denotes that the rate of material removal for a first material is greater than the rate of removal for at least another material of the structure to which the material removal process is being applied. In one embodiment, the selectivity for removing the portion of the first metal layer 6 that does not include the intermixed metal semiconductor region 7 to the intermixed metal semiconductor region 7 is greater than 10:1. In another embodiment, the selectivity for removing the portion of the first metal layer 6 that does not include the intermixed metal semiconductor region 7 to the intermixed metal semiconductor region 7 is greater than 10:1. In one embodiment, the etch process is a wet chemical etch. In one embodiment, in which the first metal layer 6 is composed of nickel and/or platinum, and the intermixed metal semiconductor region is composed of silicon intermixed with nickel and/or platinum, the etch chemistry for removing the portion of the first metal layer 6 that does not include the intermixed metal semiconductor region 7 includes the aqua regia chemistry.

Figure 3:
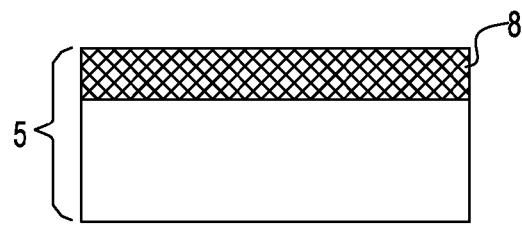
FIG. 3 is a side cross-sectional view depicting annealing the intermixed metal semiconductor region to form a textured metal semiconductor alloy, in accordance with one embodiment of the present disclosure.

FIG. 3 depicts one embodiment of annealing the intermixed metal semiconductor region 7 to form a textured metal semiconductor alloy 8. The annealing converts the amorphous crystalline structure of the intermixed metal semiconductor region 7 to a crystalline structure, such as a polycrystalline structure or a single crystal structure. As used herein, the term "single crystal" denotes a crystalline solid, in which the crystal lattice of the entire sample is substantially continuous and substantially unbroken to the edges of the sample, with substantially no grain boundaries. Polycrystalline materials are solids that are composed of many crystallites, possibly having varying size and orientation.

The textured metal semiconductor alloy 8 has grains with an in-plane alignment to the grains of the semiconductor substrate 5. The grain size of the textured metal semiconductor alloy 8 is greater than 1.5× the thickness of the textured metal semiconductor alloy 8. In another embodiment, the grain size of the textured metal semiconductor alloy 8 is greater than 2.5× the thickness of the textured metal semiconductor alloy 8. In yet another embodiment, the grain size of the textured metal semiconductor alloy 8 is greater than 3.0× the thickness of the textured metal semiconductor alloy 8.

The annealing step for forming the textured metal semiconductor alloy 8 includes, but is not limited to, rapid thermal annealing, furnace annealing, laser annealing or a combination thereof. During annealing, the intermixed metal semiconductor region 7 reacts with the semiconductor substrate 5 to form the textured metal semiconductor alloy 8. In one embodiment, the thermal anneal is completed at a temperature ranging from 350° C. to 600° C. for a time period ranging from 1 second to 90 seconds. In another embodiment, the thermal anneal is completed at a temperature ranging from 400° C. to 550° C. for a time period ranging from 1 second to 90 seconds. In one example, the thermal anneal is completed at a temperature of 450° C. for a time period ranging from 1 second to 90 seconds.

In one example, the textured metal semiconductor alloy 8 may be composed of nickel silicide ($NiSi_x$). Other examples of compositions for the textured metal semiconductor alloy 8 may include, nickel platinum silicide ($NiPt_ySi_x$), cobalt silicide ($CoSi_x$), tantalum silicide ($TaSi_x$), titanium silicide ($TiSi_x$) and combinations thereof. In one example, in which the intermixed metal semiconductor region 7 is composed of nickel silicide (NiSi), and the semiconductor substrate 5 is composed of silicon (Si), the textured metal semiconductor alloy 8 is composed of nickel silicide (NiSi), the silicon content may range from 40 at. % to 60 at. %, and the Ni content ranges from 40 at. % to 60 at. %.

The textured metal semiconductor alloy 8 may have a thickness ranging from 10 Å to 100 Å, as measured from the upper surface of the semiconductor substrate 5. In another embodiment, the textured metal semiconductor alloy 8 may have a thickness ranging from 30 Å to 60 Å, as measured from the upper surface of the semiconductor substrate 5. The texture metal semiconductor alloy 8 may have a grain size ranging from 50 Å to 10000 Å. In another embodiment, the texture metal semiconductor alloy 8 may have a grain size ranging from 500 Å to 5000 Å. Following annealing, the upper surface of the textured metal semiconductor alloy 8 may be cleaned to remove any oxide material that is present thereon. The cleaning process may include a hydrofluoric (HF) based chemistry.

Figure 4:
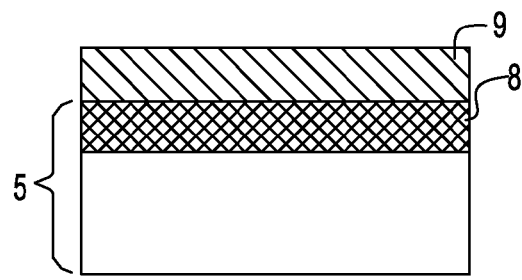
FIG. 4 is a side cross-sectional view depicting one embodiment of forming a second metal layer on the textured metal semiconductor alloy, in accordance with the present disclosure.

FIG. 4 depicts one embodiment of forming a second metal layer 9 on the textured metal semiconductor alloy 8. The second metal layer 9 may be formed using a physical vapor deposition (PVD) process, such as plating, e.g., electroplating or electroless deposition, or sputtering. Examples of sputtering apparatus that may be suitable for depositing the second metal layer 9 include DC diode type systems, radio frequency (RF) sputtering, magnetron sputtering, and ionized metal plasma (IMP) sputtering.

In one embodiment, metal is deposited onto the upper surface of the textured metal semiconductor alloy 8 to form a second metal layer 9 with a thickness ranging from 1 nm to 30 nm. In another embodiment, the second metal layer 9 is deposited to a thickness ranging from 1 nm to 20 nm. In yet another embodiment, the second metal layer 9 is deposited to a thickness ranging from 5 nm to 15 nm. The second metal layer 9 may be composed of nickel (Ni), platinum (Pt), cobalt (Co), erbium (Er), tantalum (Ta), titanium (Ti), tungsten (W), palladium (Pd) and combinations thereof.

In one example, the second metal layer 9 is composed of substantially 100 at. % nickel (Ni). In another embodiment, the second metal layer 9 may be composed of an alloy of two or metal elements, e.g., a nickel platinum (NiPt) alloy. For example, when the second metal layer 9 is composed of an alloy of nickel (Ni) and platinum (Pt), the platinum (Pt) content of the nickel platinum (NiPt) alloy may be as great as 15 at. %. In one embodiment, when the second metal layer 9 is composed of an alloy of nickel (Ni) and platinum (Pt), the platinum (Pt) content of the nickel platinum (NiPt) alloy may range from 1 at. % to 10 at. %.

Figure 5:
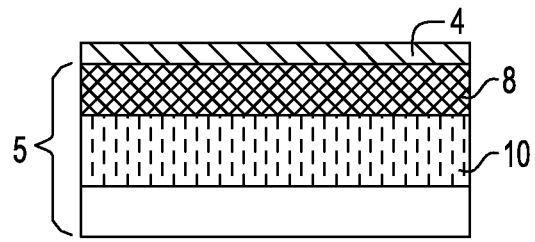
FIG. 5 is a side cross-sectional view depicting annealing the second metal layer on the textured metal semiconductor alloy to form a metal semiconductor alloy contact, in which metal elements from the second metal layer are diffused through the textured metal semiconductor alloy to provide a templated metal semiconductor alloy, in accordance with one embodiment of the present disclosure.

FIG. 5 depicts one embodiment of annealing the second metal layer 9 and the textured metal semiconductor alloy 8 to form a metal semiconductor alloy contact, in which metal elements from the second metal layer 9 are diffused through the textured metal semiconductor alloy 8 to provide a templated metal semiconductor alloy 10. Because the templated metal semiconductor alloy 10 is formed through the textured metal semiconductor alloy 8, the grains of the templated metal semiconductor alloy 10 are guided by the textured metal semiconductor alloy 8 so that the grains of the templated metal semiconductor alloy 10 have an in-plane texture.

In addition to having an in-plane texture, the grains of the templated metal semiconductor alloy 10 have a grain size that is greater than 2.0× the thickness of the templated metal semiconductor alloy 10, in which the thickness of the templated metal semiconductor alloy 10 ranges from 15 nm to 50 nm. In another embodiment, the grains of the templated metal semiconductor alloy 10 have a grain size that is greater than 3.0× the thickness of the templated metal semiconductor alloy 10, in which the thickness of the templated metal semiconductor alloy 10 ranges from 15 nm to 50 nm. In an even further embodiment, the grains of the templated metal semiconductor alloy 10 have a grain size that is greater than 3.0× the thickness of the templated metal semiconductor alloy 10, in which the thickness of the templated metal semiconductor alloy 10 ranges from 15 nm to 50 nm. In one example, the grains of the templated metal semiconductor alloy 10 have a grain size that ranges from 1.5× to 3.0× the thickness of the templated metal semiconductor alloy 10, in which the thickness of the templated metal semiconductor alloy 10 ranges from 15 nm to 50 nm.

The portion of the second metal layer 9 that is not converted to the templated metal semiconductor alloy 9 may be removed by a selective etch. The selective etch for removing the remaining portion of the second metal layer 9 is similar to the etch process that removes the portion of the first metal layer 6 that is not converted into the textured metal semiconductor alloy 7, which is described above with reference to FIG. 2. In one embodiment, in which the second metal layer 9 is composed of nickel (Ni) and/or platinum (Pt), and the templated metal semiconductor region 10 is composed of silicon (Si) intermixed with nickel (Ni) and/or platinum (Pt), the etch chemistry for removing the remaining portion of the second metal layer 9 comprises the aqua regia chemistry.

In one example, the templated metal semiconductor alloy 10 may be composed of nickel silicide (NiSi$_x$). Other examples of compositions for the templated metal semiconductor alloy 10 may include, nickel platinum silicide (NiP-t$_y$Si$_x$), cobalt silicide (CoSi$_x$), tantalum silicide (TaSi$_x$), titanium silicide (TiSi$_x$) and combinations thereof. In one example, in which the textured metal semiconductor alloy 8 is composed of nickel silicide (NiSi) and the semiconductor substrate 5 is composed of silicon (Si), the templated metal semiconductor alloy 10 has a silicon (Si) content ranging from 40 at. % to 60 at. %, and a nickel (Ni) content that ranges from 40 at. % to 60 at. %.

The templated metal semiconductor alloy 10 may have a thickness ranging from 10 Å to 100 Å, as measured from the upper surface of the semiconductor substrate 5. In another embodiment, the templated metal semiconductor alloy 10 may have a thickness ranging from 30 Å to 60 Å, as measured from the upper surface of the semiconductor substrate 5. The templated metal semiconductor alloy 10 may have a grain size ranging from 50 Å to 10000 Å. In another embodiment, the templated metal semiconductor alloy 10 may have a grain size ranging from 500 Å to 5000 Å. In one embodiment, the textured metal semiconductor alloy 8 has a crystal structure that is single crystal and the templated metal semiconductor alloy 10 has a crystalline structure that is single crystal.

In one example, when the templated metal semiconductor alloy 10 is composed of nickel platinum silicide, and the textured metal semiconductor alloy 8 is composed of nickel silicide, a platinum rich layer 4 may be present on the upper surface of the metal semiconductor alloy contact. In one embodiment, the platinum rich layer comprises greater than 10 at. % platinum.

In some embodiments, the metal semiconductor alloy contact that includes the templated metal semiconductor alloy 10 is thermally stable up to temperatures as great as 750° C. For example, a 10 nm thick templated metal semiconductor alloy 10 composed of nickel platinum silicide (NiPtSi) including 40 at. % nickel (Ni), 10 at. % platinum (Pt), and 50 at. % silicon (Si) that is formed through a textured metal semiconductor alloy 8 composed of nickel silicide (NiSi) remains thermally stable, i.e., free of agglomeration, at annealing temperatures of 650° C. for a time period of at least 30 seconds. In another example, a 10 nm thick templated metal semiconductor alloy 10 composed of nickel platinum silicide (NiPtSi) including 40 at. % nickel (Ni), 10 at. % platinum (Pt), and 50 at. % silicon (Si) that is formed through a textured metal semiconductor alloy 8 composed of nickel silicide (NiSi) remains thermally stable, i.e., free of agglomeration, at annealing temperatures of 650° C. for a time period as great as 90 seconds.

A metal semiconductor alloy of nickel (Ni) having the same thickness formed using a conventional silicidation process when subjected to an annealing temperature of 650° C. for a time period of 90 seconds displays agglomeration, i.e., thermal instability. More specifically, the upper surface of the metal semiconductor alloy that agglomerates becomes mottled or discontinuous. In comparison to the templated metal semiconductor alloy 10, a metal semiconductor alloy forming using a "conventional silicidation process" includes depositing a metal layer on a semiconductor surface, annealing to alloy the metal layer and the semiconductor surface to form a silicide, and etching the portion of the metal layer that is not converted to a silicide. The conventional silicidation process does not include the process sequence for forming the intermix metal semiconductor region 7, or processing in which a textured metal semiconductor alloy 8 is used to form a templated metal semiconductor alloy 10.

In another embodiment, a 10 nm thick templated metal semiconductor alloy 10 composed of nickel platinum silicide (NiPtSi) including 40 at. % nickel (Ni), 10 at. % platinum (Pt), and 50 at. % silicon (Si) that is formed through a textured metal semiconductor alloy 8 composed of cobalt silicide (CoSi) remains thermally stable, i.e., free of agglomeration, at annealing temperatures of 650° C. for a time period of at least 30 seconds. In one example, a 10 nm thick templated metal semiconductor alloy 10 composed of nickel platinum silicide (NiPtSi) including 40 at. % nickel (Ni), 10 at. % platinum (Pt), and 50 at. % silicon (Si) that is formed through a textured metal semiconductor alloy 8 composed of cobalt silicide (CoSi) remains thermally stable, i.e., free of agglomeration, at annealing temperatures of 750° C. for a time period as great as 90 seconds. A metal semiconductor alloy of nickel having the same thickness formed using a conventional silicidation process when subjected to an annealing temperature of 650° C. for a time period of 90 seconds displays agglomeration, i.e., thermal instability.

In another aspect of the present disclosure, a thermally stable metal semiconductor alloy region is provided that is capable of withstanding the high thermal budget of replacement metal gate processing. In one embodiment, the present disclosure provides a thermally stable metal semiconductor alloy by forming a textured metal semiconductor alloy from a metal semiconductor intermixed region prior to the replacement metal gate process, and forming a templated metal semiconductor alloy through the textured metal semiconductor alloy after the replacement gate process, as depicted in FIGS. 6-12.

Although FIGS. 6-12 depict forming a field effect transistor (FET), the method is equally suitable for any semiconductor device including a gate structure. A field effect transistor (FET) is a semiconductor device in which output current, i.e., source-drain current, is controlled by the voltage applied to a functional gate structure 19. A field effect transistor (FET) has three terminals, i.e., a functional gate structure 19, a source region 12 and a drain region 13. The functional gate structure 19 is used to control output current, i.e., flow of carriers in the channel region 15, of a semiconducting device, such as a field effect transistor (FET), through electrical or magnetic fields.

Figure 6:
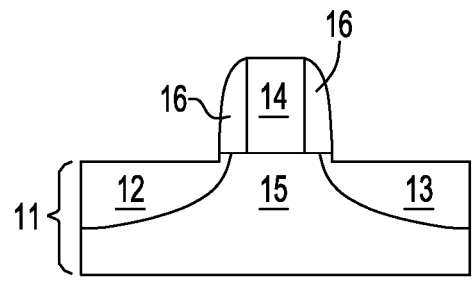
FIG. 6 is a side cross-sectional view depicting providing a semiconductor substrate comprising a source region and a drain region on opposing sides of a sacrificial gate structure, in accordance with one embodiment of the present disclosure.

FIG. 6 depicts one embodiment of a semiconductor substrate 11 having a source region 12 and a drain region 13 on opposing sides of the semiconductor substrate 11 that is underlying a sacrificial gate structure 14. The portion of the semiconductor substrate 11 that is underlying the sacrificial gate structure 14 is the channel region 15 of the semiconductor substrate 11. The channel region 15 of the semiconductor substrate 11 is the region between the source region 12 and the drain region 13 of a semiconductor device that becomes conductive when the semiconductor device, e.g., field effect transistor, is turned on. The source region 12 is a doped region in the semiconductor device, in which majority carriers are flowing into the channel region 15. The drain region 13 is the doped region in semiconductor device 11 located at the end of the channel region 15, in which carriers are flowing out of the semiconductor device through the drain region 13. The semiconductor substrate 11 that is depicted in FIG. 6 is similar to the semiconductor substrate 5 depicted in FIG. 1. Therefore, the description for the semiconductor substrate 5 depicted in FIG. 1 is applicable to the semiconductor substrate 11 that is depicted in FIG. 6.

A sacrificial gate structure 14 is formed on the portion of the semiconductor substrate 11 in which the channel region 15 is present. In replacement gate technology, a sacrificial material dictates the geometry and location of the later formed functional gate structure. The sacrificial material is used to form the doped regions of the semiconductor substrate 11, such as the source region 12 and the drain region 13. The sacrificial gate structure 14 is then replaced with the functional gate structure. By employing a sacrificial gate structure 14, the thermal budget that is applied to the functional gate structure may be reduced.

The sacrificial gate structure 14 may be composed of any material that can be etched selectively to the underlying semiconductor substrate 11. In one embodiment, the sacrificial gate structure 14 may be composed of a silicon-containing material, such as polysilicon. Although, the sacrificial gate structure 14 is typically composed of a semiconductor material, the sacrificial gate structure 14 may also be composed of a dielectric material, such as an oxide, nitride or oxynitride material, or amorphous carbon.

The material that provides the sacrificial gate structure 14 may be patterned and etched to provide the sacrificial gate structure 14. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions.

At least one dielectric spacer 16 is then formed adjacent to the sacrificial gate structure 14, i.e., in direct contact with the sidewall of the sacrificial gate structure 14. In one embodiment, the at last one dielectric spacer 16 may be formed by using a blanket layer deposition, such as chemical vapor deposition, and an anisotropic etchback method. The at least one spacer 16 typically has a width ranging from 2.0 nm to 15.0 nm, and may be composed of a dielectric, such as a nitride, oxide, oxynitride, or a combination thereof.

The source region 12 and the drain region 13 may be formed in portions of the semiconductor substrate 11 on opposing sides of the portion of the semiconductor substrate 11 that the sacrificial gate structure 14 is present on. In one embodiment, the source region 12 and the drain region 13 are formed using an ion implantation process. More specifically, when forming a p-type source region 12 and drain region 13, a typical dopant species is boron or $BF_2$. Boron may be implanted utilizing implant energies ranging from 0.2 keV to 3.0 keV with an implant dose ranging from $5\times10^{14}$ atoms/cm² to $5\times10^{15}$ atoms/cm². $BF_2$ may be implanted utilizing implant energies ranging from 1.0 keV to 15.0 keV and a dose ranging from $5\times10^{14}$ atoms/cm² to $5\times10^{15}$ atoms/cm². A typical implant for the n-type source region 12 and the drain region 13 is arsenic. The n-type source region 12 and the drain region 13 can be implanted with arsenic using implant energies ranging from 1.0 keV to 10.0 keV with a dose ranging from $5\times10^{14}$ atoms/cm² to $5\times10^{15}$ atoms/cm².

Figure 7:
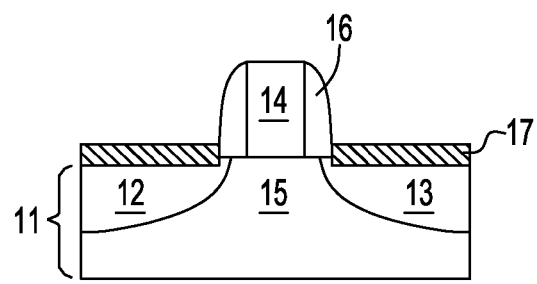
FIG. 7 is a side cross-sectional view depicting forming a textured metal semiconductor alloy the source and drain regions of the semiconductor substrate depicted in FIG. 6, in accordance with one embodiment of the present disclosure.

FIG. 7 depicts one embodiment of forming a textured metal semiconductor alloy 17 on the source and drain regions 12, 13 of the semiconductor substrate 11 depicted in FIG. 6. The textured metal semiconductor alloy 17 that is depicted in FIG. 7 is formed from a metal semiconductor intermixed region. More specifically, and in one embodiment, the textured metal semiconductor alloy 17 is formed by a sequence that includes depositing a first metal layer on the source region 12 and drain region 13 of the semiconductor substrate 11 by a sputtering process in which the first metal layer and the semiconductor substrate 11 intermix to form the metal semiconductor intermixed region. The remaining portion of the first metal layer that is not converted to the metal semiconductor intermixed region is then removed, and the metal semiconductor intermixed region is annealed to provide the textured metal semiconductor alloy 17. The textured metal semiconductor alloy 17 is similar in composition, dimensions, crystal structure and method of forming as the textured metal semiconductor alloy 8 that is described above with reference to FIGS. 1-3. Therefore, the description for the textured metal semiconductor alloy 8 that is described above with reference to FIGS. 1-3 is applicable to the textured metal semiconductor alloy region 17 that is depicted in FIG. 7.

Figure 8:
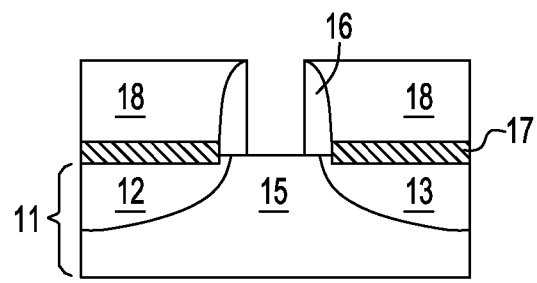
FIG. 8 is a side cross-sectional view depicting forming at least one dielectric layer on the textured metal semiconductor alloy having a first opening exposing the sacrificial gate structure, and removing the sacrificial gate structure, in accordance with one embodiment of the present disclosure.

FIG. 8 depicts forming at least one dielectric layer 18 on the textured metal semiconductor alloy region 17 having a first opening exposing the sacrificial gate structure 14, and removing the sacrificial gate structure 14 to expose the channel region 15 of the semiconductor substrate 11. The at least one dielectric layer 18 is deposited atop the source region 12, drain region 13, and sacrificial gate structure 14. The at least one dielectric layer 18 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the at least one dielectric layer 18 may also be formed using spinning from solution, spraying from solution, and evaporation.

Following deposition, the at least one dielectric layer 18 is planarized until the upper surface of the sacrificial gate structure 14 is exposed. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

The sacrificial gate structure 14 is removed to provide an opening to a channel region 15 of the semiconductor substrate 11. The sacrificial gate structure 14 is typically removed using a selective etch process that removes the sacrificial gate structure 14 selective to the semiconductor substrate 11, the at least one dielectric spacer 16 and the at least one dielectric layer 18. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch.

Figure 9:
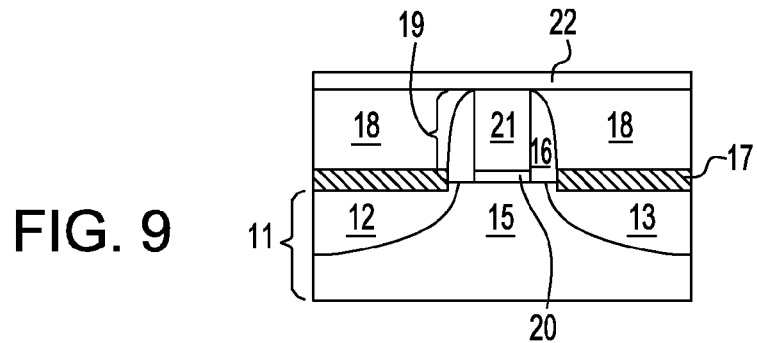
FIG. 9 is a side cross-sectional view of forming a function gate structure to replace the sacrificial gate structure, in accordance with one embodiment of the present disclosure.

FIG. 9 depicts one embodiment of forming a function gate structure 19 in the opening formed by removing the sacrificial gate structure 14. The functional gate structure 19 may include at least one gate dielectric layer 20 on the channel region 15 of the semiconductor substrate 5, and at least one gate conductor 21 on at least one gate dielectric layer 20.

The at least one gate dielectric layer 20 may be composed of a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric that provides the at least one gate dielectric layer 20 is comprised of a material having a dielectric constant that is greater than 4.0, e.g., 4.1. In another embodiment, the high-k gate dielectric that provides the at least one gate dielectric layer 20 is comprised of a material having a dielectric constant greater than 7.0. In yet another embodiment, the high-k gate dielectric that provides the at least one gate dielectric layer 20 is comprised of a material having a dielectric constant ranging from greater than 4.0 to 30. The dielectric constants mentioned herein are relative to a vacuum at room temperature, i.e., 20° C. to 25° C.

In one example, the at least one gate dielectric layer 20 is provided by hafnium oxide ($HfO_2$). Other examples of suitable high-k dielectric materials for the at least one gate dielectric layer 20 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the at least one gate dielectric layer 20 is formed using a deposition process, such as chemical vapor deposition (CVD). In another embodiment, the at least one gate dielectric layer 20 may be formed by a thermal growth process such as, for example, oxidation, nitridation or oxynitridation. The at least one gate dielectric layer 20 may have a thickness ranging from 1 nm to 5 nm. In another embodiment, the at least one gate dielectric layer 20 has a thickness ranging from 1 nm to 2.5 nm. In yet another example, the at least one gate dielectric layer 20 has a thickness that ranges from 15 Å to 20 Å.

At least one gate conductor layer 21 is formed on the at least one gate dielectric layer 20. In one embodiment, the at least one gate conductor layer 21 is composed of a metal, such as a work function metal layer. In one embodiment, in which the semiconductor device is an n-type semiconductor device, the work function metal layer that provides the at least one gate conductor layer 21 is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering, e.g., DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen.

In another embodiment, the work function metal layer may be a p-type work function metal layer. As used herein, a "p-type work function metal layer" is a metal layer that effectuates a p-type threshold voltage shift. In one embodiment, the work function of the p-type work function metal layer 24 ranges from 4.9 eV to 5.2 eV. As used herein, "threshold voltage" is the lowest attainable gate voltage that will turn on a semiconductor device 110, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering, e.g., DC diode type systems, radio frequency (RF) sputtering, magnetron sputtering, and ionized metal plasma (IMP) sputtering.

A cap layer 22 may be formed atop the upper surface of the at least one gate conductor layer 21 and the upper surface of the at least one dielectric layer 18. In one example, the cap layer 22 is composed of silicon nitride ($Si_3N_4$). The cap layer 22 may be deposited using chemical vapor deposition (CVD). Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the cap layer 22 may also be formed using spinning from solution, spraying from solution, and evaporation.

Figure 10:
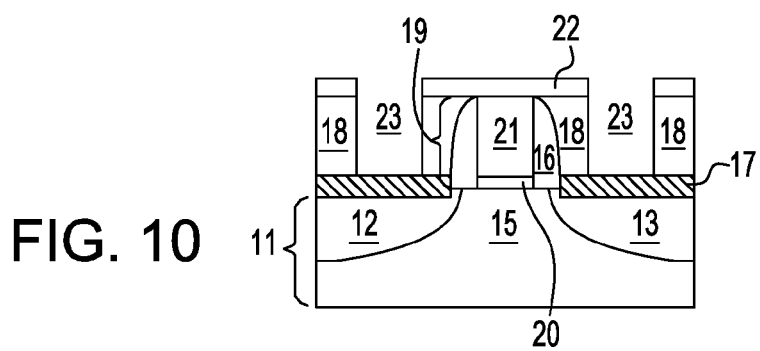
FIG. 10 is a side cross-sectional view depicting one embodiment of etching a second opening through the at least one dielectric layer selective to the textured metal semiconductor alloy, in accordance with the present disclosure.

FIG. 10 depicts one embodiment of etching an opening 23 through the cap layer 22 and the at least one dielectric layer 18 selective to the textured metal semiconductor alloy 17. The openings 23 may be formed through the cap layer 22 and the at least one dielectric layer 18 to expose an upper surface the textured metal semiconductor alloy 17 that is present on the source region 12 and the drain region 13. The openings 23 may be formed using photolithography and etch processes. For example, a photoresist etch mask can be produced by applying a photoresist layer to the upper surface of the cap layer 22, exposing the photoresist layer to a pattern of radiation, and then developing the pattern into the photoresist layer utilizing a resist developer. The photoresist etch mask may be positioned so that portions of the cap layer 22 and the at least one dielectric layer 18 are not protected by the photoresist etch mask in order to provide the openings 23. The exposed portion of the cap layer 22 and the at least one dielectric layer 18 is then removed by a selective etch. The selective etch may be an anisotropic etch or an isotropic etch. One example of an anisotropic etch process suitable for forming the openings 23 is reactive ion etch. The selective etch may terminate on the textured metal semiconductor alloy 17. In this embodiment, the textured metal semiconductor alloy 17 functions as an etch stop.

Figure 11:
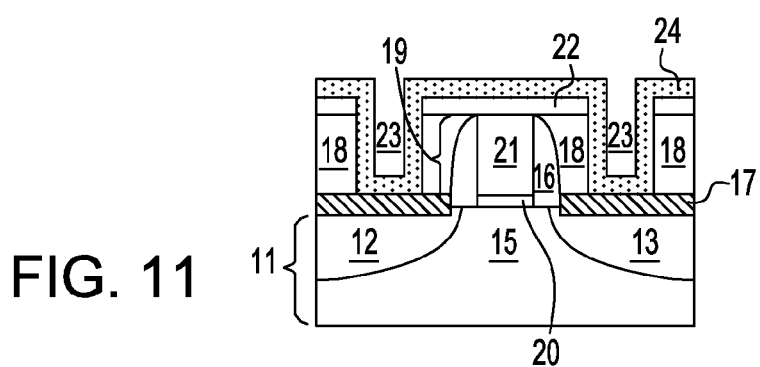
FIG. 11 is a side cross-sectional view depicting forming a second metal layer on the textured metal semiconductor alloy, in accordance with the present disclosure.

FIG. 11 depicts one embodiment of forming a second metal layer 24 on the textured metal semiconductor alloy 17. In one embodiment, the second metal layer 24 is conformally deposited on the sidewalls and base of the openings 23 to textured metal semiconductor alloy 17. The second metal layer 24 may also be present on the upper surface of the cap layer 22. The term "conformal layer" and "conformally deposited layer" denotes a layer having a thickness that does not deviate from greater than or less than 20% of an average value for the thickness of the layer. The second metal layer 24 may be deposited using physical vapor deposition (PVD) methods. Examples of physical vapor deposition (PVD) that are suitable for forming the second metal layer 24 include sputtering and plating. The second metal layer 24 is similar in composition, dimensions, crystal structure and method of forming as the second metal layer 9 that is described above with reference to FIG. 4. Therefore, the description for the second metal layer 9 that is described above with reference to FIG. 4 is applicable to the second metal layer 24 that is depicted in FIG. 11.

In one example, the second metal layer 24 is composed of substantially 100 at. % nickel (Ni). In another embodiment, the second metal layer 24 may be composed of an alloy of two or metal elements, e.g., a nickel platinum alloy (NiPt). For example, when the second metal layer 24 is composed of an alloy of nickel (Ni) and platinum (Pt), the platinum (Pt) content of the nickel platinum (NiPt) alloy may be as great as 15 at %. In one embodiment, when the second metal layer 24 is composed of an alloy of nickel and platinum (NiPt), the platinum content (Pt) of the nickel platinum alloy (NiPt) may range from 1 at. % to 10 at. %.

Figure 12:
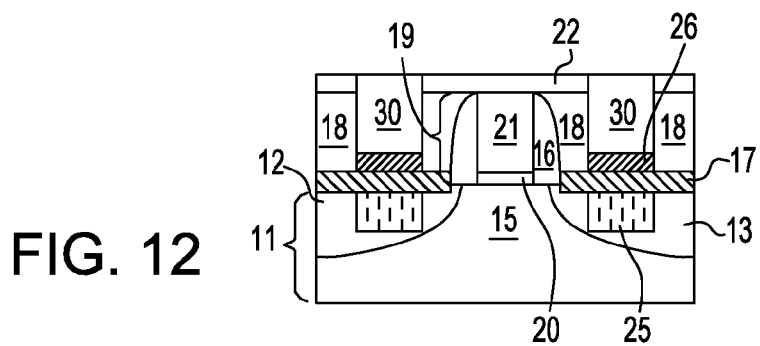
FIG. 12 is a side cross-sectional view depicting annealing the second metal layer on the textured metal semiconductor alloy to form a templated metal semiconductor alloy, wherein the textured metal semiconductor alloy and the templated metal semiconductor alloy provide a metal semiconductor alloy contact to the at least one of the source region and the drain region, in accordance with one embodiment of the present disclosure.

FIG. 12 depicts one embodiment of annealing the second metal layer 24 on the textured metal semiconductor alloy 17 to form a templated metal semiconductor alloy 25, wherein the textured metal semiconductor alloy 17 and the templated metal semiconductor alloy 25 provide a metal semiconductor alloy contact to the region 12 and the drain region 13. The annealing of the second metal layer 24 on the textured metal semiconductor alloy 17 is similar to the annealing of the second metal layer 9 and the textured metal semiconductor alloy 8 that is described above with reference to FIG. 5. Therefore, the annealing that is described with reference to FIG. 5 is applicable to the anneal process for forming the templated metal semiconductor alloy 25 from the second metal layer 9 and the textured metal semiconductor alloy 17 that is depicted in FIG. 12. The portion of the second metal layer 9 that is not converted to the templated metal semiconductor alloy 9 may be removed by a selective etch. In one embodiment, the templated metal semiconductor alloy 25 has edges that are substantially aligned to the sidewalls of the opening 23 that the second metal layer 24 is deposited in.

Because the templated semiconductor alloy 25 is formed through the textured metal semiconductor alloy 17, the grains of the templated metal semiconductor alloy 25 are guided by the textured metal semiconductor alloy 17 so that the grains of the templated metal semiconductor alloy 25 have an in-plane texture. In addition to having an in-plane texture, the grains of the templated metal semiconductor alloy 25 have a grain size that is greater than 2.0× the thickness of the templated metal semiconductor alloy 25. In another embodiment, the grains of the templated metal semiconductor alloy 25 have a grain size that is greater than 3.0× the thickness of the templated metal semiconductor alloy 25. In yet another embodiment, the grains of the templated metal semiconductor alloy 25 have a grain size that is greater than 3.5× the thickness of the templated metal semiconductor alloy 25. In one example, a 10 nm thick templated metal semiconductor alloy 25 composed of nickel platinum silicide (NiPtSi) including 40 at. % nickel (Ni), 10 at. % platinum (Pt), and 50 at. % silicon (Si) that is formed through a textured metal semiconductor alloy 17 composed of 100 at. % nickel (Ni) remains thermally stable, i.e., free of agglomeration, at annealing temperatures of 650° C. for a time period as great as 90 seconds.

The thickness of the templated metal semiconductor alloy 25 ranges from 15 nm to 50 nm. Further, in some embodiments, the metal semiconductor alloy including the templated metal semiconductor alloy 25 is thermally stable up to temperatures as great as 750° C. The examples of thermal stability that have been described above with reference to FIGS. 1-5 are equally applicable to the templated metal semiconductor alloy 25 formed using the methods depicted in FIGS. 6-12.

In one example, the templated metal semiconductor alloy 25 may be composed of nickel silicide ($NiSi_x$). Other examples of compositions for the templated metal semiconductor alloy 9 may include, nickel platinum silicide ($NiPt_ySi_x$), cobalt silicide ($CoSi_x$), tantalum silicide ($TaSi_x$), titanium silicide ($TiSi_x$) and combinations thereof. In one example, in which the textured metal semiconductor alloy 17 is composed of nickel silicide (NiSi) and the semiconductor substrate 5 is composed of silicon (Si), the templated metal semiconductor alloy 25 has a silicon (Si) content ranging from 40 at. % to 60 at. %, and a nickel (Ni) content that ranges from 40 at. % to 60 at. %.

The templated metal semiconductor alloy 25 may have a thickness ranging from 10 Å to 100 Å, as measured from the upper surface of the semiconductor substrate 11. In another embodiment, the templated metal semiconductor alloy 25 may have a thickness ranging from 30 Å to 60 Å, as measured from the upper surface of the semiconductor substrate 11. The templated metal semiconductor alloy 25 may have a grain size ranging from 50 Å to 10000 Å. In another embodiment, the templated metal semiconductor alloy 25 may have a grain size ranging from 500 Å to 5000 Å. In one embodiment, the templated metal semiconductor alloy 25 has a crystalline structure that is single crystal.

In one example, when the templated metal semiconductor alloy 25 is composed of nickel platinum silicide (NiPtSi), and the textured metal semiconductor alloy 17 is composed of nickel silicide (NiSi), a platinum (pt) rich layer 26 may be present on an upper surface of the metal semiconductor alloy contacts to the source region 12 and the drain region 13. In one embodiment, the platinum rich layer comprises greater than 10 at. % platinum.

Referring to FIG. 12, an interconnect 30 may be formed in direct contact with the metal semiconductor alloy contact. Interconnects 30 are formed by depositing a conductive metal into the openings using a deposition process, such as physical vapor deposition (PVD). Examples of physical vapor deposition (PVD) that are suitable for forming the interconnect 30 include sputtering and plating. Examples of sputtering apparatuses suitable for forming the interconnect 30 include DC diode type systems, radio frequency (RF) sputtering, magnetron sputtering, and ionized metal plasma (IMP) sputtering. The interconnect 30 may also be formed using chemical vapor deposition. The interconnect 30 may be composed of a conductive metal, such as tungsten, copper, aluminum, silver, gold, and alloys thereof.

The following examples are provided to further illustrate the structures and methods of the present disclosure, and demonstrate some advantages that arise therefrom. It is not intended that the claims be limited to the specific examples disclosed.

Pole Figure of Templated Metal Semiconductor Alloy

Figure 13A:
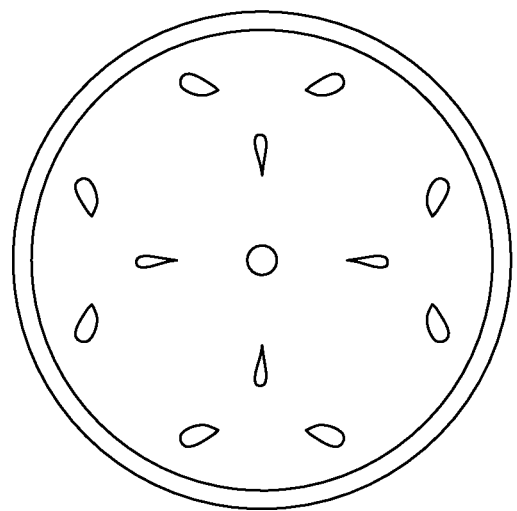
FIGS. 13(a) and 13(b) depict pole figures produced by X-ray diffraction (XRD) of metal semiconductor alloys.
Figure 13B:
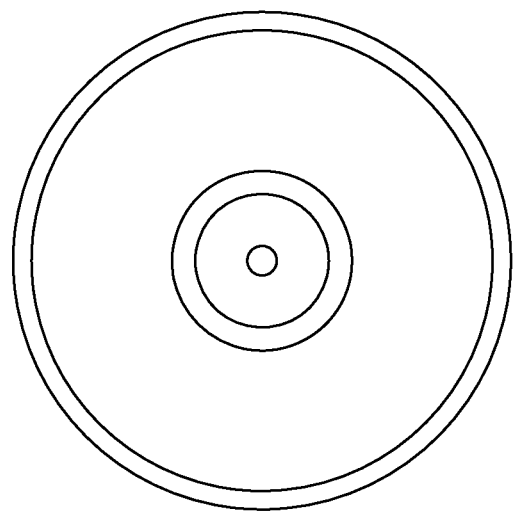

FIGS. 13(a) and 13(b) depict pole figures produced by X-ray diffraction (XRD) of metal semiconductor alloys. A pole figure is a stereographic projection that represents the orientation distribution of crystallographic lattice planes in crystallography. FIG. 13(a) is a pole figured produced by X-ray diffraction (XRD) of a metal semiconductor alloy including a templated metal semiconductor alloy 10, 25 as described with reference to FIGS. 1-12 of the present disclosure. The metal semiconductor alloy used to provide the pole figure depicted in FIG. 13(a) has a thickness of 10 nm and included a templated metal semiconductor alloy composed of 40 at. % nickel (Ni), 10 at. % platinum (Pt), and 50 at. % silicon (Si) that is formed through a textured metal semiconductor alloy 17 composed of nickel (Ni) silicide, as described above with reference to FIGS. 1-5. The pole figure depicted in FIG. 13(a) is along crystalline plane (011) with a d-spacing of 2.84 Å, and is indicative of a metal semiconductor alloy having an in-plane texture.

FIG. 13(b) is the pole figure of a comparative metal semiconductor alloy formed using a conventional silicidation process. The comparative metal semiconductor alloy did not include a templated metal semiconductor alloy and was not formed through a textured metal semiconductor alloy. The comparative metal semiconductor alloy has a thickness of 10 nm and is composed of nickel silicide (NiSi). The pole figure depicted in FIG. 13(b) is along crystalline plane (011) with a d-spacing of 2.84 Å, and is indicative of a metal semiconductor alloy having a fiber texture.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of a forming a metal semiconductor alloy comprising:
   forming a first metal layer on a semiconductor substrate to provide an intermixed metal semiconductor region to a first depth of the semiconductor substrate without thermal diffusion;
   removing a portion of the first metal layer that does not include the intermixed metal semiconductor region;
   first annealing the intermixed metal semiconductor region to form a textured metal semiconductor alloy;
   forming a second metal layer on the textured metal semiconductor alloy; and
   second annealing the second metal layer on the textured metal semiconductor alloy, wherein diffusion of metal elements from the second metal layer through the textured metal semiconductor alloy provides a templated metal semiconductor alloy having a grain size that is greater than 2.0×, wherein the templated metal semiconductor alloy has a thickness ranging from 15 nm to 50 nm.

2. The method of claim 1, wherein the textured metal semiconductor alloy has a crystal structure that is single crystal and the templated metal semiconductor alloy has a crystalline structure that is single crystal.

3. The method of claim 1, wherein the crystal structure of the textured metal semiconductor alloy has a same orientation as the crystal structure of the templated metal semiconductor alloy.

4. The method of claim 1, wherein the templated metal semiconductor alloy comprises metal semiconductor crystal grains having an in-plane texture to semiconductor crystal grains of the substrate at an interface between the substrate and the templated metal semiconductor alloy.

5. The method of claim 1, wherein the metal semiconductor contact does not agglomerate up to temperatures of 750° C.

6. The method of claim 1 further comprising removing oxide from the textured metal semiconductor alloy with a selective etch prior to forming the second metal layer.

7. A method of forming a semiconductor device comprising:
   providing a substrate comprising a source region and a drain region on opposing sides of a sacrificial gate structure;
   forming a first metal layer on at least one of the source region and the drain region to provide an intermixed metal semiconductor region to a first depth of the semiconductor substrate without thermal diffusion;
   removing a portion of the first metal layer that does not include the intermixed metal semiconductor region;
   first annealing the intermixed metal semiconductor region to form a textured metal semiconductor alloy to a first depth of the substrate;
   forming at least one dielectric layer on the textured metal semiconductor alloy having a first opening exposing the sacrificial gate structure;

replacing the sacrificial gate structure with a functioning gate structure;

etching a second opening through the at least one dielectric layer selective to the textured metal semiconductor alloy;

forming a second metal layer on the textured metal semiconductor alloy; and second annealing the second metal layer on the textured metal semiconductor alloy to form a templated semiconductor alloy to a second depth of the substrate that is greater than the first depth of the substrate, wherein the textured metal semiconductor alloy and the templated semiconductor alloy provide a metal semiconductor alloy contact to the at least one of the source region and the drain region.

8. The method of claim 7, wherein the a templated semiconductor alloy has a grain size that is greater than 2× a thickness of the metal semiconductor alloy for a metal semiconductor alloy having ranging from 15 nm to 50 nm.

9. The method of claim 7, wherein the textured metal semiconductor alloy has a crystal structure that is single crystal and the templated metal semiconductor alloy has a crystalline structure that is single crystal.

10. The method of claim 7, wherein the crystal structure of the textured metal semiconductor alloy has a same orientation as the crystal structure of the templated metal semiconductor alloy.

11. The method of claim 7, wherein the templated metal semiconductor alloy comprises metal semiconductor crystal grains having an in-plane texture to semiconductor crystal grains of the substrate at an interface between the substrate and the templated metal semiconductor alloy.

12. The method of claim 7, wherein the metal semiconductor alloy contact does not agglomerate up to temperatures of 750° C.

13. The method of claim 7 further comprising removing oxide from the textured metal semiconductor alloy with a selective etch prior to forming the second metal layer.

\* \* \* \* \*